United States Patent
Agarwal et al.

(10) Patent No.: US 8,443,135 B2
(45) Date of Patent: May 14, 2013

(54) EXHAUSTIVE PARAMETER SEARCH ALGORITHM FOR INTERFACE WITH NAND FLASH MEMORY

(75) Inventors: Gaurav Agarwal, Houston, TX (US); Daniel J. Allred, Missouri City, TX (US)

(73) Assignee: Texas Instruments Incorporated, Dallas, TX (US)

( * ) Notice: Subject to any disclaimer, the term of this patent is extended or adjusted under 35 U.S.C. 154(b) by 203 days.

(21) Appl. No.: 12/913,040

(22) Filed: Oct. 27, 2010

(65) Prior Publication Data

US 2011/0145484 A1    Jun. 16, 2011

Related U.S. Application Data

(60) Provisional application No. 61/255,297, filed on Oct. 27, 2009.

(51) Int. Cl.
*G06F 13/00* (2006.01)
*G06F 13/28* (2006.01)

(52) U.S. Cl.
USPC ......... 711/103; 711/E12.008; 713/1; 713/100

(58) Field of Classification Search ............... 711/103, 711/E12.008; 713/1, 100
See application file for complete search history.

(56) References Cited

U.S. PATENT DOCUMENTS

| | | | | |
|---|---|---|---|---|
| 5,237,689 | A | * | 8/1993 | Behnke .................... 713/1 |
| 2006/0195650 | A1 | * | 8/2006 | Su et al. .................. 711/103 |
| 2008/0086631 | A1 | * | 4/2008 | Chow et al. ............. 713/2 |
| 2010/0161888 | A1 | * | 6/2010 | Eggleston ............... 711/103 |

* cited by examiner

*Primary Examiner* — Edward Dudek, Jr.
(74) *Attorney, Agent, or Firm* — Robert D. Marshall, Jr.; Wade James Brady, III; Frederick J. Telecky, Jr.

(57) ABSTRACT

The Exhaustive Parameter Search (EPS) algorithm of this invention enables communicating devices to access to a large variety of NAND Flash memories. The EPS algorithm exploits the fact that the parameters needed for successful initial communication with NAND Flash memory (block Size and page Size) have only few possible values. The EPS algorithm tries all possible values to find a magic number stored in the NAND Flash memory. The correct parameters for the particular NAND Flash memory are read after detection of the magic number. This ensures that accurate parameters are used after successful detection of the magic number detection. The OEM must write the known parameters of the NAND Flash memory in a predetermined location following the magic number.

14 Claims, 3 Drawing Sheets

EXHAUSTIVE PARAMETER SEARCH ALGORITHM FOR INTERFACE WITH NAND FLASH MEMORY

CLAIM OF PRIORITY

This application claims priority under 35 U.S.C. 119(e)(1) to U.S. Provisional Application No. 61/255,297 filed Oct. 27, 2009.

TECHNICAL FIELD OF THE INVENTION

The technical field of this invention is electronic interface with varying types of NAND FLASH memory.

BACKGROUND OF THE INVENTION

Many electronic devices store program instruction in Flash memory generally in NAND Flash. In particular it is usual to store portions of the initial operational program of the electronic device, known as the "boot code," in NAND Flash. The boot process usually requires multiple stages. The process generally starts with a read only memory (ROM) boot loader (RBL). Based on the selected boot mode the RBL interfaces with the appropriate storage media such as NAND Flash, MMC, SD and EEPROM. The RBL controls copying the user boot loader (UBL) from the selected non-volatile storage media to device volatile memory. The UBL then begins execution. Generally the UBL copies the application or application kernel image to the device volatile memory and begins the application.

A NAND Flash memory generally includes the following parameters: a device ID; a block size; a page size; and a number of blocks. A NAND Flash memory is often used in the boot process described above. Communication with a NAND Flash requires the communicating device to know the NAND Flash parameters. Knowledge of the block size and the page size are sufficient. Usually this parameter information can be read from the device ID of the NAND Flash memory. An alternative way of getting this information uses a table look up indexed through the device ID of the NAND Flash memory. The boot process can continue once the communicating device obtains the needed parameters. In absence of this parameter information, the communicating device cannot access the NAND Flash memory. In this case boot fails.

If the communicating device can access the NAND Flash memory, the boot process will follow. Copying of UBL to the device volatile memory is controlled by RBL in a multi-step process. The RBL looks for UBL descriptor on Block 0 of page 0 of the NAND Flash memory. The UBL descriptor starts with a fixed magic number (hexadecimal "A1ACED00") which identifies the UBL descriptor. Any block of the NAND Flash memory can be marked as bad. If the UBL descriptor magic number is not found on block 0 of page 0, the RBL tries to read it from Block 1 of page 0. This search continues until the magic number is found or a predetermined number of reads occurs. The UBL descriptor should reside on Page 0 of the first good block.

The information following the magic number contains the address and length of UBL on the NAND Flash memory. The communicating device uses this information to locate and copy the UBL to device volatile memory. Upon completing this copying, the UBL starts execution and the RBL boot is complete.

There are problems with the conventional boot process. It can be difficult to read the NAND parameters from the NAND device ID during boot time due to lack of standardization among NAND Flash memory manufactures. This may cause boot failure. The NAND Flash memory market is volatile with NAND specifications changing about every 2 years. This makes it difficult for communicating devices to be able to access new generations of NAND Flash memories. This makes it difficult for the original equipment manufacturer (OEM) to obtain suitable NAND Flash memories at the best price. Using a table look up indexed through the device ID doesn't solve this problem. A volatile NAND Flash memory market means a lot of work to keep the table up to date and a lot of memory required to cover all NAND Flash memories. The specification volatility is partly driven by changes in the number of bits allocated to error correcting codes (ECC). Older NAND Flash memories used 8 bits for ECC per 512-byte sector. Some NAND Flash memory manufacturers have a device roadmap requiring a 24-bit ECC with 1024-byte sectors.

SUMMARY OF THE INVENTION

This invention is a new algorithm, called Exhaustive Parameter Search (EPS), which enables communicating devices to access to a large variety of NAND Flash memories. The Exhaustive Parameter Search Algorithm (EPS) solves the parameters read issue from the NAND Flash memory that result in boot failure due to device's inability to access the NAND Flash memory. The EPS algorithm exploits the observation that the parameters needed for successful initial communication with NAND Flash memory (block Size and page Size) have only few possible values. The correct value for a particular NAND Flash memory is one of these possible combinations. The EPS algorithm tries all possible values to find the magic number. Since more than one possible combination can lead to success read of the initial data, the EPS regards initial estimate to be approximate. The correct parameters for the particular NAND Flash memory are read after detection of the magic number. This ensures accurate parameters are used for memory access after locating the magic number. The OEM must write the known parameters of the NAND Flash memory in a predetermined location following the magic number.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
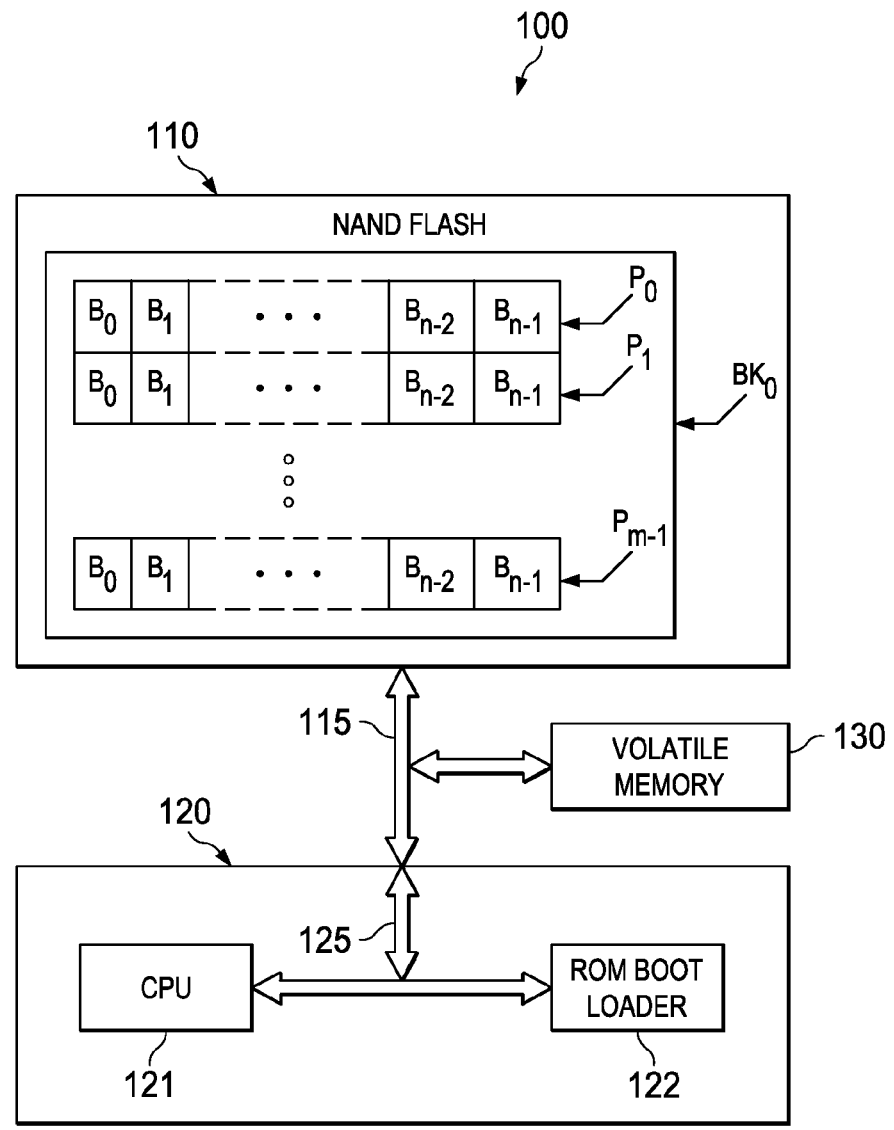
FIG. 1 illustrates a schematic view of a known electronic system to which this invention is applicable.

FIG. 1 illustrates a schematic view of a known electronic system 100 including NAND Flash memory 110, controller 120 and volatile memory 130. In a typical system NAND Flash memory 110, controller 120 and volatile memory 130 will be embodied in separate integrated circuits.

NAND Flash memory 110 includes a plurality of blocks, each including a plurality of pages which include a plurality of bytes. FIG. 1 illustrates one exemplary block $BK_0$ as including m pages $P_0$ to $P_{m-1}$. Each of pages $P_0$ to $P_{m-1}$ includes n bytes $B_0$ to $B_{n-1}$. While FIG. 1 illustrates a single block $BK_0$, this represents what in general would include plural blocks.

NAND Flash memory 110 is connected to controller 120 via bus 115. Controller 120 includes central processing unit (CPU) 121 and ROM boot loader 122 connected via bus 125. Bus 125 is further connected to bus 115. ROM boot loader 122 is illustrated as placed on the controller integrated circuit 120 with CPU 121. Those skilled in the art would realize that ROM boot loader 122 could be embodied as a separate integrated circuit. In general a practical electronic device 100 would include parts not illustrated in FIG. 1, such as: user input devices; user output devices; additional non-volatile and volatile memory; and communication channels. FIG. 1 illustrates only those parts necessary to understand the invention and not all parts necessary to form a useful device.

CPU 121 serves as the brain of electronic system 100 operating on stored instructions to perform desired tasks. This patent application is most concerned with the initialization of electronic system 100. The first program instructions executed by CPU 121 are stored in ROM boot loader 122.

Volatile memory 130 is also connected to controller 120 via bus 115. Volatile memory 130 serves as the working memory of electronic system 100. Typically all operating data and currently executing programs are stored in volatile memory 130. In a typical instance of electronic system 100 volatile memory 130 is embodied by dynamic random access memory (DRAM) or synchronous dynamic random access memory (SDRAM). Though illustrated as a single block those skilled in the art would realize that volatile memory 130 could be embodied by a more complex structure such as including multi-level cache memory.

Figure 2:
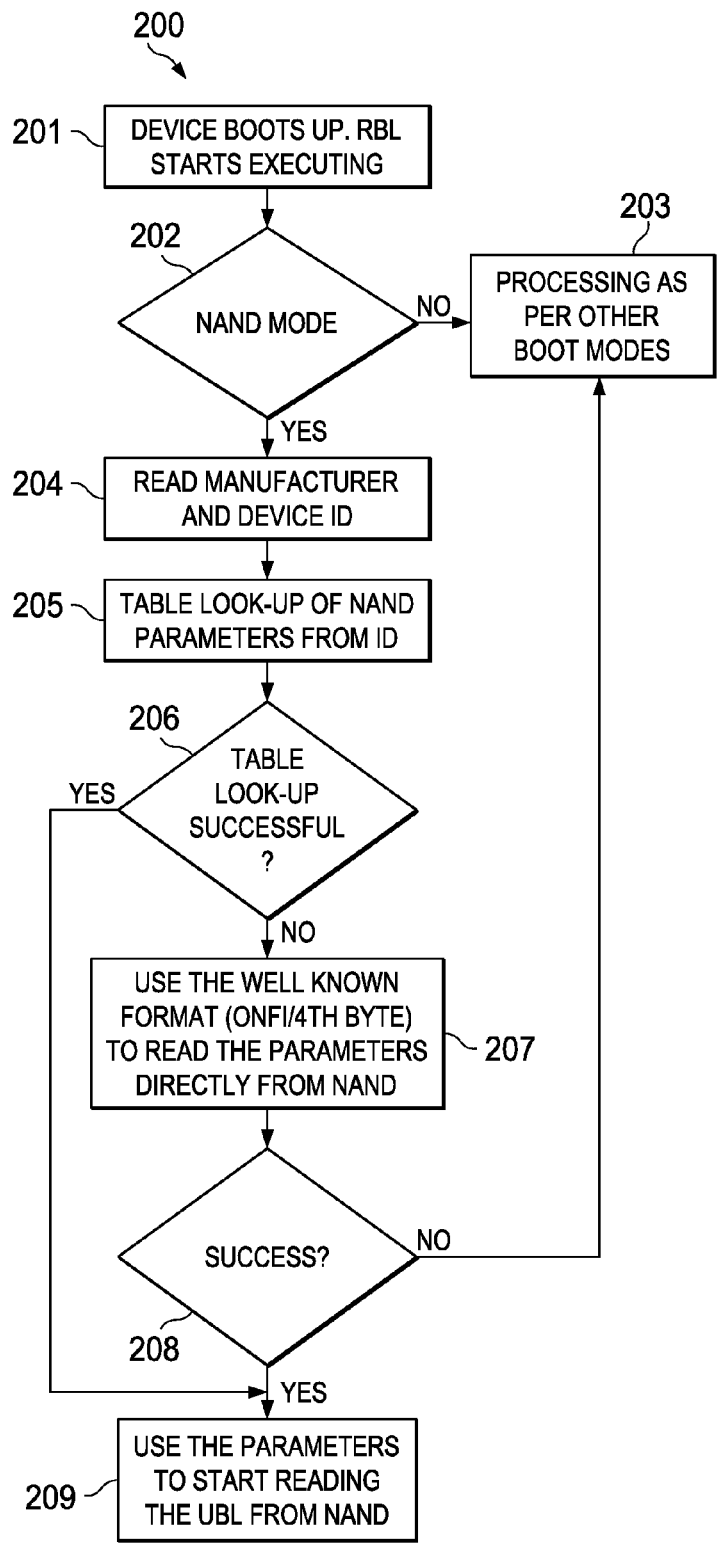
FIG. 2 is flow chart illustrating details of one prior art NAND Flash memory boot process.

FIG. 2 is flow chart illustrating details of one prior art method 200 of the NAND Flash memory boot process. Method 200 begins upon initialization of electronic system 100, such as upon first initiating electric power. Block 201 is the initial step of CPU 121. This initial step includes any hardware start-up process of CPU 121 such as initial self-test. Following such hardware controlled processes, CPU 121 begins program operation using instructions stored in a pre-determined address location within ROM boot loader 122.

Decision block 202 determines if the electronic system includes a NAND Flash boot memory. If not (No at decision block 202), then program 200 is no longer applicable. Flow proceeds to block 203 to process in the other boot mode. If the electronic system uses NAND Flash boot memory (Yes at decision block 202), then program 200 advances to block 204 which reads the manufacture and device ID of the NAND Flash memory. Block 205 uses the identity data read in block 204 in a table look-up operation. The table stores the parameters necessary to access the NAND Flash memory corresponding to particular identity data.

Decision block 206 determines if the table look-up was successful. If the table look-up was not successful (No at decision block 206), then flow proceeds to block 207. The table look-up could fail if the look-up table has no index matching the identity data read in block 204. Block 207 uses a known format (fourth ID byte or ONFI parameter data) as the default format to directly read the NAND Flash memory parameters.

Decision block 208 determines if this known format read is successful. If not (No at decision block 208), then program 200 flows to block 203 to process in the other boot mode. Program 200 had determined that NAND Flash boot memory is not used and program 200 is no longer applicable.

If the table look-up was successful (Yes at decision block 206) or if the default format read was successful (Yes at decision block 208), then block 209 continues the boot process using the user boot loader (UBL) stored in the NAND Flash memory. Program 200 has now determined the parameters needed to access the NAND Flash memory. The typical boot process copies the UBL from the NAND Flash memory to volatile memory 130, transfers control to the UBL copy in volatile memory 130 and continues the start up process. This completes program 200.

Figure 3:
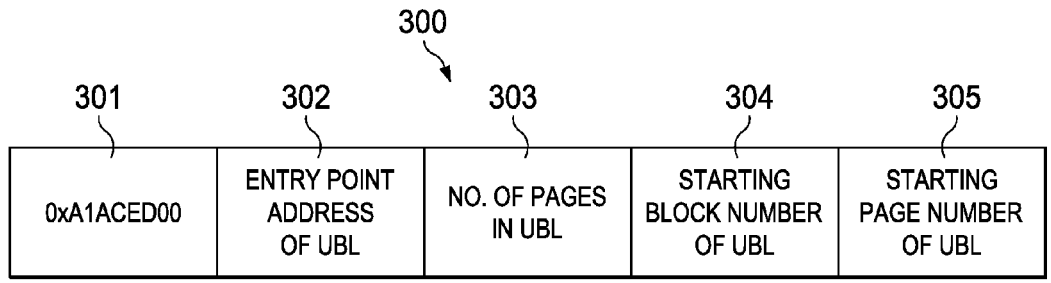
FIG. 3 illustrates the user boot loader descriptor data stored in NAND Flash memory to enable the boot process according to the prior art.

FIG. 3 illustrates the UBL descriptor format data stored in NAND Flash memory to enable the boot process according to the prior art. This is the format type used in block 207. Boot data 300 includes the fixed magic number 301. The data at location 302 is the entry point address within the NAND Flash memory of the UBL. The data at location 303 is the number of memory pages of the UBL. The data at location 304 is the starting block number of the UBL. The data at location 305 is the starting page number of the UBL. Recall that a NAND Flash memory typically includes plural blocks and plural pages.

Another prior art solution to this problem is taught in Chua et al U.S. Patent Application Publication No. 2007/0061498 "METHOD AND SYSTEM FOR NAND-FLASH IDENTIFICATION WITHOUT READING DEVICE ID TABLE." This published patent application publication includes the following steps. The method writes a pre-defined ASCII pattern at on block 0 and page 0. This published patent application teaches an 8 byte "IDENTITY" pattern which fills the page. The method selects an initial set of NAND Flash memory parameters and attempts to read this just written pattern. If the read is not successful, the method tries a next set of parameters. If the read was successful, the end of read indicates the end of the page and hence the page length. The successful parameter set is used for access to the NAND Flash memory.

Figure 4:
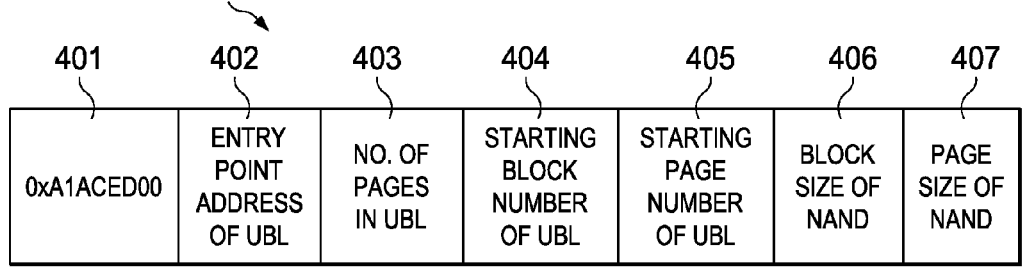
FIG. 4 illustrates user boot loader descriptor data stored in NAND Flash memory to enable the boot process according to this invention.

FIG. 4 illustrates the UBL descriptor format data stored in NAND Flash memory to enable the boot process according to this invention. The data at location 401 is the fixed magic number. The data at location 402 is the entry point address within the NAND Flash memory of the UBL. The data at location 403 is the number of memory pages of the UBL. The data at location 404 is the starting block number of the UBL. The data at location 405 is the starting page number of the UBL. The data at locations 401 to 405 is the same as the prior art illustrated in FIG. 3. The data at location 406 is the block size of the NAND Flash memory. The data at location 407 is the page size of the NAND Flash memory. Recall that the block size and page size parameters are sufficient to enable access to a NAND Flash memory.

Figure 5:
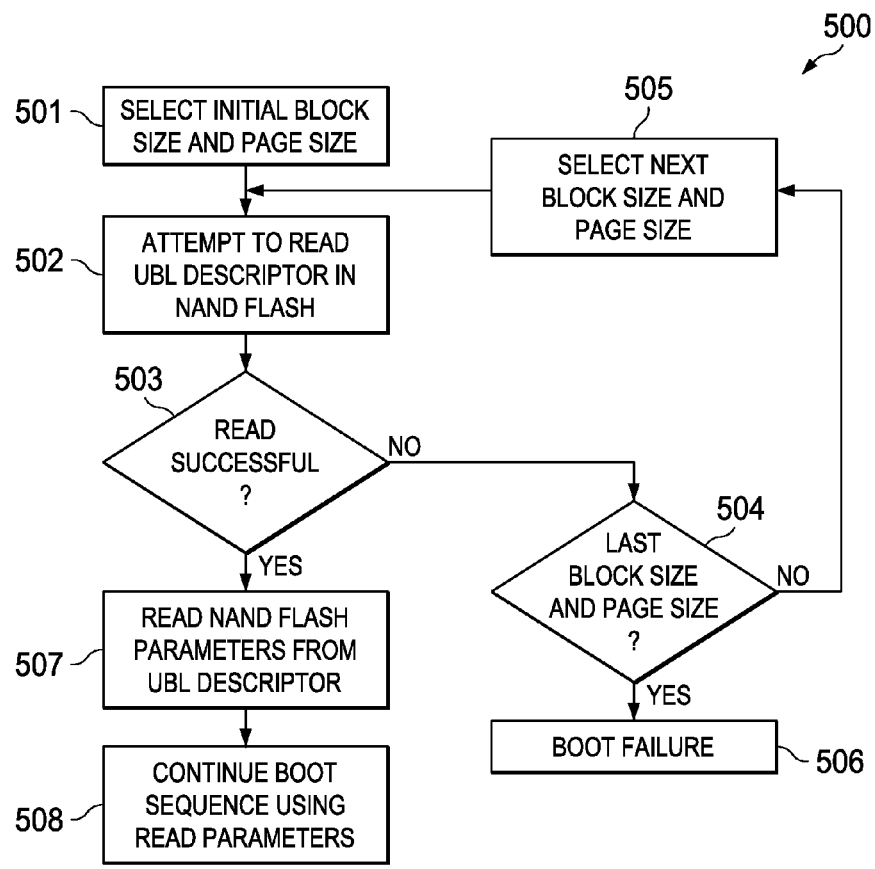
FIG. 5 illustrates the method of this invention.

FIG. 5 illustrates method 500 of this invention. Method 500 begins at block 501 selecting an initial block size and page size. Block 502 uses the currently selected block size and page size to attempt to read the UBL descriptor from the NAND Flash memory. Note that knowledge of the block size and page size is sufficient to enable access to the NAND Flash memory. On the first iteration of block 502 the current selected block size and page size are the initial block size and page size of block 501.

Decision block 503 tests to determine if this read was correct. This determination is made by comparing the read data to the fixed magic number. If the read was not successful (No at decision block 503), method 500 proceeds to decision block 504.

Decision block 504 determines if the current block size and page size were the last block size and page size. If the current block size and page size were not the last (No at decision block 504), method 500 advances to block 505. Block 505 selects a next block size and page size. Method 500 returns to block 502 and attempts to read the UBL descriptor from the NAND Flash memory using the newly selected block size and page size. If the current block size and page size were the last (Yes at decision block 504), then the NAND Flash memory cannot be read. Block 506 indicates a boot failure. This ends program 500.

If the read in block 502 was successful (Yes at decision block 503), method 500 proceeds to block 507. Block 507 uses the current block size and page size to read the data at locations 406 and 407 of the UBL descriptor. This involves a read at a predetermined address offset from the magic number. This data is the block size and page size written into the NAND Flash memory. Block 508 continues the boot loader sequence as described above using these read NAND Flash memory parameters. This ends program 500.

This algorithm is called exhaustive parameter search algorithm (EPS). This algorithm is based on the observation that the parameters needed for successful initial communication with NAND Flash memory (block size and page size) have only few possible values. The correct value for a particular NAND Flash memory is one of a few possible combinations. For example the block size is within the range of 32 KB, 64 KB, 128 KB, 256 KB, 512 KB, 1 MB, 1.5 MB and 2 MB and the page size is within the range of 1 KB, 2 KB, 4 KB, 8 KB, 16 KB and 32 KB. Since both the block size and the page size are generally integral powers of 2, it is possible to predict the block size and page size for future NAND Flash memories not currently manufactured. This permits a current ROM boot loader to extend to currently not used future generations of NAND Flash memory. Trying all possible values of block size and page size will result in a successful read of the UBL descriptor.

There is another factor which makes it desirable to read the NAND Flash memory parameters. More than one possible combination of block size and page size can lead to correctly reading the UBL. However only one of these combinations will permit access to all parts of the NAND Flash memory. Thus the original read of the UBL descriptor provides only a tentative set of parameters. The correct parameters for the NAND Flash memory are read from the end of the UBL descriptor. The OEM will know the parameters of for a particular NAND Flash memory and can write these parameters at the end of the UBL descriptor.

Selection of the initial block size and page size and of the next block size and page size can include individual selection of the block size and page size. For example, the next block size and page size may include the same block size and the next page size until all page sizes are exhausted. Then selection of the next block size and page size selects a next block size and the first page size. New selections then include the second block size and the next page size until all page sizes are exhausted. Alternately, the possible block size may be tested for each page size before advancing to a next page size.

The EPS algorithm compares to the algorithm of Chua et al U.S. Patent Application Publication No. 2007/0061498 "METHOD AND SYSTEM FOR NAND-FLASH IDENTIFICATION WITHOUT READING DEVICE ID TABLE" as follows. These algorithms are similar in that both look for a pre-defined pattern in the NAND Flash memory and both use estimated NAND Flash memory parameters. These algorithms do differ significantly. A key part of the algorithm of the published patent application is writing to a whole page of the NAND Flash memory. The EPS of this invention does not write to the NAND Flash memory. The algorithm of the published patent application uses the estimated NAND Flash memory parameters that permitted successful read of data from the NAND Flash memory. The EPS of this invention doesn't continue to use those estimated NAND Flash memory parameters following a successful read. The EPS of this invention instead reads the correct NAND Flash memory parameters from the UBL descriptor previously written by the OEM. This results in more accurate results as compared to algorithm of the published patent application because where the estimated parameters might permit access to some but not all of the NAND Flash memory. Thirdly, the EPS algorithm of this invention only searches page size and block size the algorithm of the published patent application searches many other parameters such as address bytes and I/O interface bits. This makes EPS algorithm of this invention much simpler to use. The EPS of this invention will work with bad blocks. The algorithm of the published patent application does not. NAND manufactures can't guarantee that block 0 and page 0 where the ID data is preferably stored is good.

This EPS algorithm has several key advantageous. If the block size and page size list is exhaustive, this algorithm will result in successful reading of the access parameters. It is expected that the program code to practice this algorithm will be small. This algorithm does not require additional non-volatile memory types such as electrically erasable programmed read only memory (EEPROM).

The following listing is pseudo code of the EPS algorithm.

Listing 1

```
#define NUM_BLOCK_SIZE 7
#define NUM_PAGE_SIZE 6
    /* Block and page size in KB */
const int blockSize[NUM_BLOCK_SIZE] = { 32, 64, 128, 256,
    512, 1024, 1536};
const int pageSize[NUM_PAGE_SIZE] = { 1, 2, 4, 8, 16, 32};
boot success = FALSE;
void eps_find_ubl_descriptor( )
{
    int blockIndex, pageIndex;
    for (blockIndex = 0; blockIndex < NUM_BLOCK_SIZE;
        blockIndex++)
    {
        for (pageIndex = 0; pageIndex < NUM_PAGE_SIZE;
            pageIndex++)
        {
            if (read_ubl_descriptor(blockSize
                [blockIndex], pageSize[pageIndex]) ==
                TRUE)
            {       /* Found the UBL_HEADER */
                    success = TRUE;
                    goto startBoot ;
            }
        }
    }
    startBoot:
    if (success == TRUE)
    {           /* continue with the boot process */
    }
    else
    {           /* Try other boot mode */
    }
}
```

The code for "read_ubl_descriptor" already exists in the existing ROM code as part of another function. This invention puts this code to a new use.

What is claimed is:

1. A method of determining access parameters of a memory comprising the steps of:
    selecting an initial set of access parameters;
    attempting to read data from a predetermined address of the memory using a current set of access parameters;
    comparing the read data with predetermined identity data;
    if the read data does not match said predetermined identity data, selecting a next set of access parameters and repeating said steps of attempting to read data from the predetermined address of the memory and comparing the read data with predetermined identity data;
    if the read data matches said predetermined identity data, reading a set of access parameters from the memory at a predetermined address offset from said predetermined address; and
    determining a set of access parameters for access to the memory as said set of access parameters read from the memory.

2. The method of claim 1, wherein:
    said memory is a NAND Flash memory.

3. The method of claim 2, wherein:
    said access parameters include block size and page size.

4. The method of claim 3, wherein:
    said block size is selected from a set including 32 KB, user boot loader descriptor data including a set of access parameters stored at a predetermined address offset from said predetermined address and
        a user boot loader program;
    a volatile memory; and
    a central processing unit connected to said read only memory, said NAND Flash memory and said volatile memory, said central processing unit operable upon initial activation of electric power to access said ROM boot loader program stored in said read only memory, said ROM boot loader program controlling said central processing unit to
        select an initial set of access parameters,
        attempt to read data from said predetermined address of said NAND Flash memory using a current set of access parameters,
        compare said read data with said predetermined identity data,
        if said read data does not match said predetermined identity data, select a next set of access parameters and repeating said attempt to read data from said predetermined address of said NAND Flash memory and said compare of said read with said predetermined identity data,
        if said read data matches said predetermined identity data, read said set of access parameters from said NAND Flash memory at said predetermined address offset from said identity data,
        copy said user boot loader program from said NAND Flash memory to said volatile memory using said read set of access parameters to access said NAND Flash memory, and
        transfer control of said central processing unit to said user boot loader program stored in said volatile 64 KB, 128 KB, 256 KB, 512 KB, 1 MB, 1.5 MB and 2 MB.

5. The method of claim 3, wherein:
    said page size is selected from a set including 1 KB, 2 KB, 4 KB, 8 KB, 16 KB and 32 KB.

6. The method of claim 3, wherein:
    said step of selecting a next set of access parameters includes retaining a current block size and selecting a next page size until all of a predetermined set of page sizes are selected, then selecting a next block size and a first page size and repeating for all of a predetermined set of block sizes.

7. The method of claim 3, wherein:
    said step of selecting a next set of access parameters includes retaining a current page size and selecting a next block size until all of a predetermined set of block sizes are selected, then selecting a next page size and a first block size and repeating for all of a predetermined set of page sizes.

8. The method of claim 1, further comprising:
    storing the predetermined identity data in the memory at said predetermined address; and
    storing the set of access parameters in the memory at the predetermined address offset from the predetermined address.

9. An electronic system comprising:
    a read only memory storing a ROM boot loader program;
    a NAND Flash memory storing
        predetermined identity data at a predetermined address, memory.

10. The electronic system of claim 9, wherein:
    said access parameters include block size and page size.

11. The electronic system of claim 10, wherein:
    said block size is selected from a set including 32 KB, 64 KB, 128 KB, 256 KB, 512 KB, 1 MB, 1.5 MB and 2 MB.

12. The electronic system of claim 10, wherein:
    said page size is selected from a set including 1 KB, 2 KB, 4 KB, 8 KB, 16 KB and 32 KB.

13. The electronic system of claim 10, wherein:
    selecting a next set of access parameters includes retaining a current block size and selecting a next page size until all of a predetermined set of page sizes are selected, then selecting a next block size and a first page size and repeating for all of a predetermined set of block sizes.

14. The electronic system of claim 10, wherein:
    selecting a next set of access parameters includes retaining a current page size and selecting a next block size until all of a predetermined set of block sizes are selected, then selecting a next page size and a first block size and repeating for all of a predetermined set of page sizes.

* * * * *